(12) United States Patent
Huang et al.

(10) Patent No.: US 7,300,187 B2
(45) Date of Patent: Nov. 27, 2007

(54) LED DEVICE WITH AN ACTIVE HEAT-DISSIPATION DEVICE

(75) Inventors: Bin-Juine Huang, Taipei (TW);
Jin-Hua Wang, Xinzhuang (TW);
Kun-Hung Lo, Taichung Hsien (TW);
Po-Chien Hsu, Zhanghua Hsien (TW);
Yung-Ching Wang, Taipei Hsien (TW)

(73) Assignee: L&C Lighting Technology Corp. (TW)

( * ) Notice: Subject to any disclaimer, the term of this patent is extended or adjusted under 35 U.S.C. 154(b) by 130 days.

(21) Appl. No.: 11/255,936

(22) Filed: Oct. 24, 2005

(65) Prior Publication Data

US 2007/0091622 A1    Apr. 26, 2007

(51) Int. Cl.
*F21V 29/00* (2006.01)
(52) U.S. Cl. .................. 362/373; 362/294; 362/345
(58) Field of Classification Search ............. 361/711, 361/717, 718; 362/373, 545, 547, 233, 294, 362/345; 165/104.26, 104.33
See application file for complete search history.

(56) References Cited

U.S. PATENT DOCUMENTS

| | | | | |
|---|---|---|---|---|
| 4,350,026 | A * | 9/1982 | Klein | 62/333 |
| 6,527,422 | B1 * | 3/2003 | Hutchison | 362/373 |
| 7,210,832 | B2 * | 5/2007 | Huang | 362/547 |

* cited by examiner

*Primary Examiner*—Sharon Payne
(74) *Attorney, Agent, or Firm*—Hershkovitz & Associates, LLC; Abe Hershkovitz

(57) ABSTRACT

A light-emitting diode (LED) device has a shade, an active heat-dissipation device and an LED module. The shade has a cavity. The active heat-dissipation device is mounted in the cavity in the shade and has a cooling board, an evaporator, a condenser, a compressor, an expansion valve and a refrigerant. The evaporator, condenser, compressor and expansion valve connect to each other to form a loop. The refrigerant is set in the loop. The LED module is mounted to the active heat-dissipation device and has at least one LED. The active heat-dissipation device dissipates the heat from the LED and even lowers the temperature of the LED under ambient temperature.

13 Claims, 4 Drawing Sheets

LED DEVICE WITH AN ACTIVE HEAT-DISSIPATION DEVICE

BACKGROUND OF THE INVENTION

1. Field of the Invention

The present invention relates to a light-emitting diode (LED) device, and more particularly to an LED device that has multiple LEDs and an active heat-dissipation device to dissipate the heat from the LEDs without depending on the ambient temperature and ventilation and even lowering the temperature of the LEDs under ambient temperature.

2. Description of the Related Art

Light-emitting diodes (LEDs) are power saving and are used generally for traffic signals, electric billboards, electric torches, desk lamps and projectors. However, LEDs with high power generate extreme heat when operating. Without a heat-dissipation device, the extreme heat from the operating LEDs may probably burn out the LEDs or greatly reduce their useful life.

In general, a core of an LED can bear a maximum temperature of 120° C., which is far lower than the temperatures that conventional bulbs can withstand. Therefore, the life of LEDs depends on the quality of a heat-dissipation device for the LEDs.

Furthermore, the intensity of an LED is relevant to the core temperature of the LED. Lowering the core temperature increases the intensity of the LED, as shown in the following Table 1.

TABLE 1

| LED $T_1$° C. | Relative intensity | Intensity increase from $T_1$ = 90° C. |
| --- | --- | --- |
| 90 | 75 | Baseline |
| 60 | 87 | +16% |
| 50 | 91 | +21% |
| 45 | 93 | +24% |
| 40 | 95 | +27% |
| 25 | 100 | +33% |

Table 1 shows a relation of the core temperature (Tj) and the intensity of the LED. For instance, the life of an LED increases from 15,000 hours to 60,000 hours when a temperature of a base on which the LED is mounted is lowered from 85° C. to 55° C. and simultaneously the core temperature of the LED is lowered from 101° C. to 81° C.

Obviously, lowering the core temperature of the LED improves the life and intensity of the LED. Therefore, an LED device needs to be equipped with a heat-dissipation device to maintain the LED device at a low temperature to improve the life of the LED.

A conventional heat-dissipation device for an LED device has a heat sink and a fan. The heat sink is made of metal and is mounted to the LED device. The fan is mounted to the heat sink. However, the operating fan generates noise.

With reference to FIG. 4, an LED device has a hollow shade (93), a base (90), multiple LEDs (91) and a looped heat pipe (LHP) (92). The base (90) is mounted in the shade (93). The LEDs (91) are mounted to the base (90). The LHP (92) is mounted around the shade (93), is connected to the base (90) and has an axial channel and a liquid. The liquid exists in the axial channel and has a fine volatility. When the LEDs (91) operate and generate heat, the liquid in the LHP (92) absorbs the heat, flows along the LHP (92) and dissipates the heat through the whole LHP (92) and the shade (93). However, the heat-dissipation effect of the LHP (92) decreases when the size of the LED device becomes larger.

Moreover, both of the aforementioned heat sink and LHP provide a passive heat dissipation that depends on the difference between the ambient temperature and the temperature of the LEDs, and on the ambient ventilation. The seat sink and the LHP work ineffectively when the ambient temperature is close to the temperature of the LEDs or when ambient ventilation is bad.

To overcome the shortcomings, the present invention provides an LED device with an active heat-dissipation device to mitigate or obviate the aforementioned problems.

SUMMARY OF THE INVENTION

The main objective of the invention is to provide a light-emitting diode (LED) device that has multiple LEDs and an active heat-dissipation device to dissipate the heat from the LEDs without depending on the ambient temperature and ventilation and even lowering the temperature of the LEDs under ambient temperature.

An LED device in accordance with the present invention comprises a shade, an active heat-dissipation device and an LED module.

The shade has a cavity.

The active heat-dissipation device is mounted in the cavity in the shade and has a cooling board, an evaporator, a condenser, a compressor, an expansion valve and a refrigerant. The evaporator, condenser, compressor and expansion valve connect to each other to form a loop. The refrigerant is set in the loop.

The LED module is mounted to the active heat-dissipation device and has at least one LED.

Other objectives, advantages and novel features of the invention will become more apparent from the following detailed description when taken in conjunction with the accompanying drawings.

DETAILED DESCRIPTION OF THE PREFERRED EMBODIMENT

Figure 1:
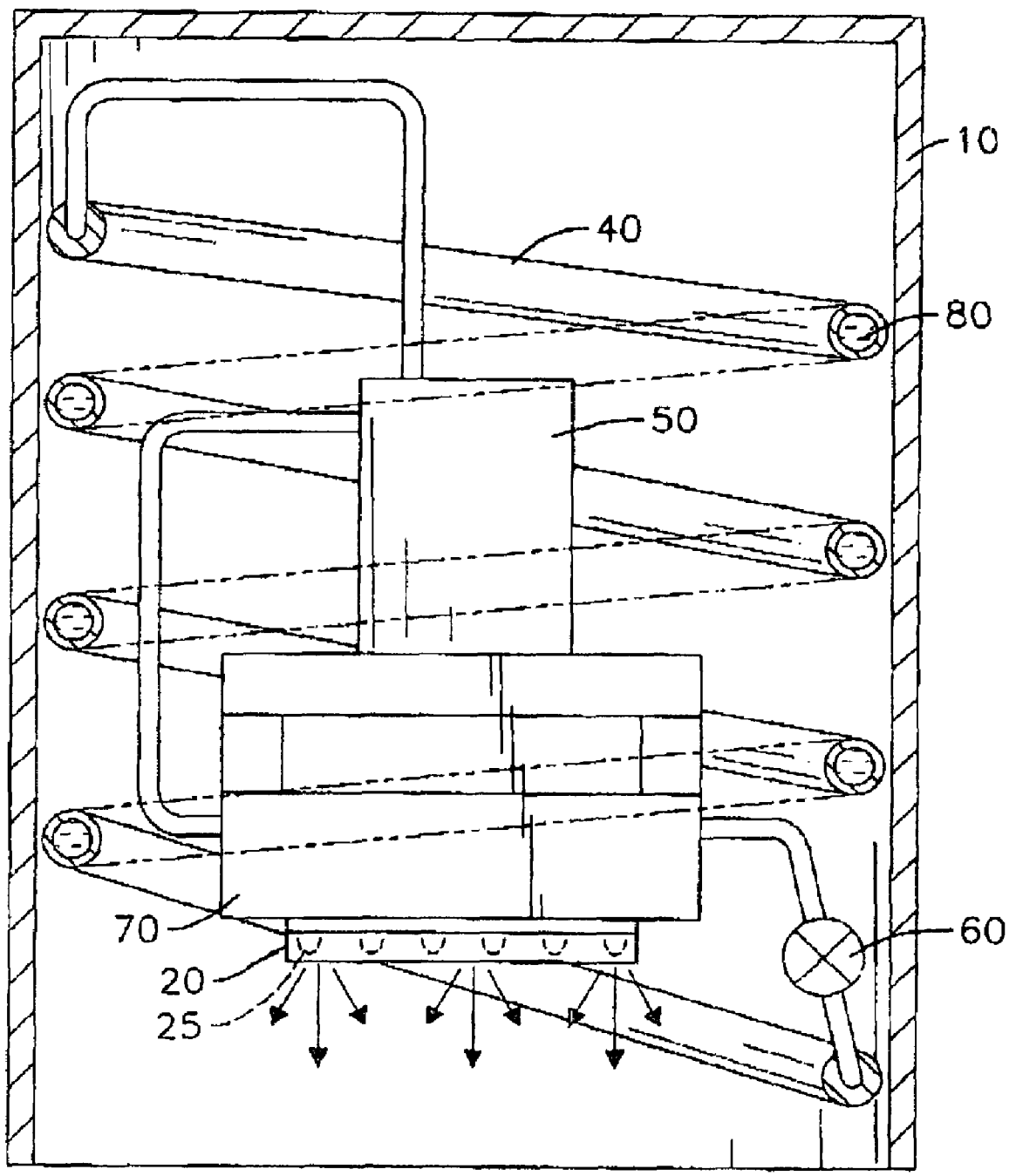
FIG. 1 is a side view in partial section of a light-emitting diode (LED) device in accordance with the present invention.
Figure 2:
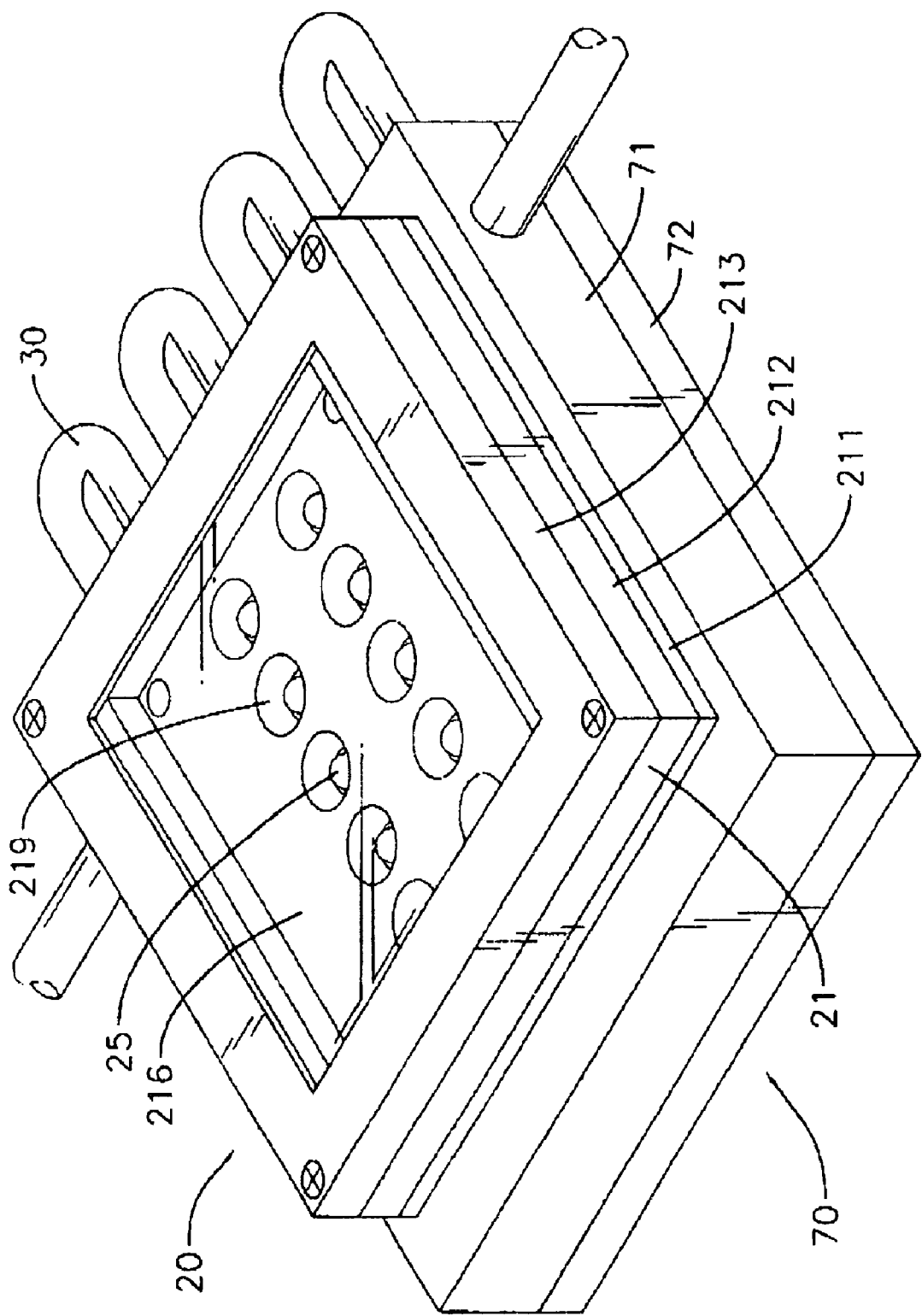
FIG. 2 is an enlarged perspective view of the LED module and evaporator of the LED device in FIG. 1.

With reference to FIGS. 1 and 2, a light emitting diode (LED) device in accordance with the present invention comprises a shade (10), an active heat-dissipation device and an LED module (20).

Figure 3:
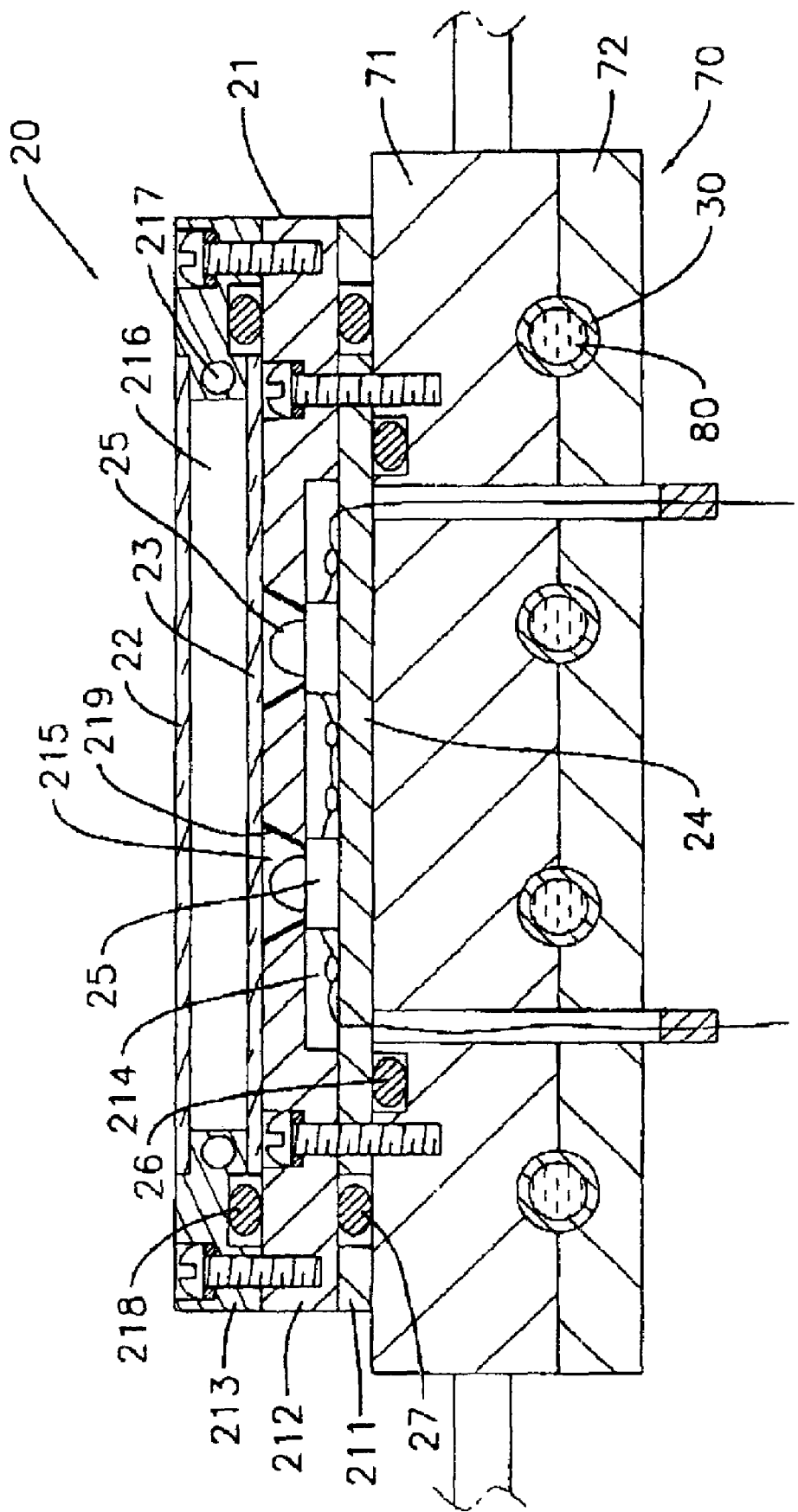
FIG. 3 is a cross-sectional side view of the LED module and evaporator of the LED device in FIG. 2.
Figure 4:
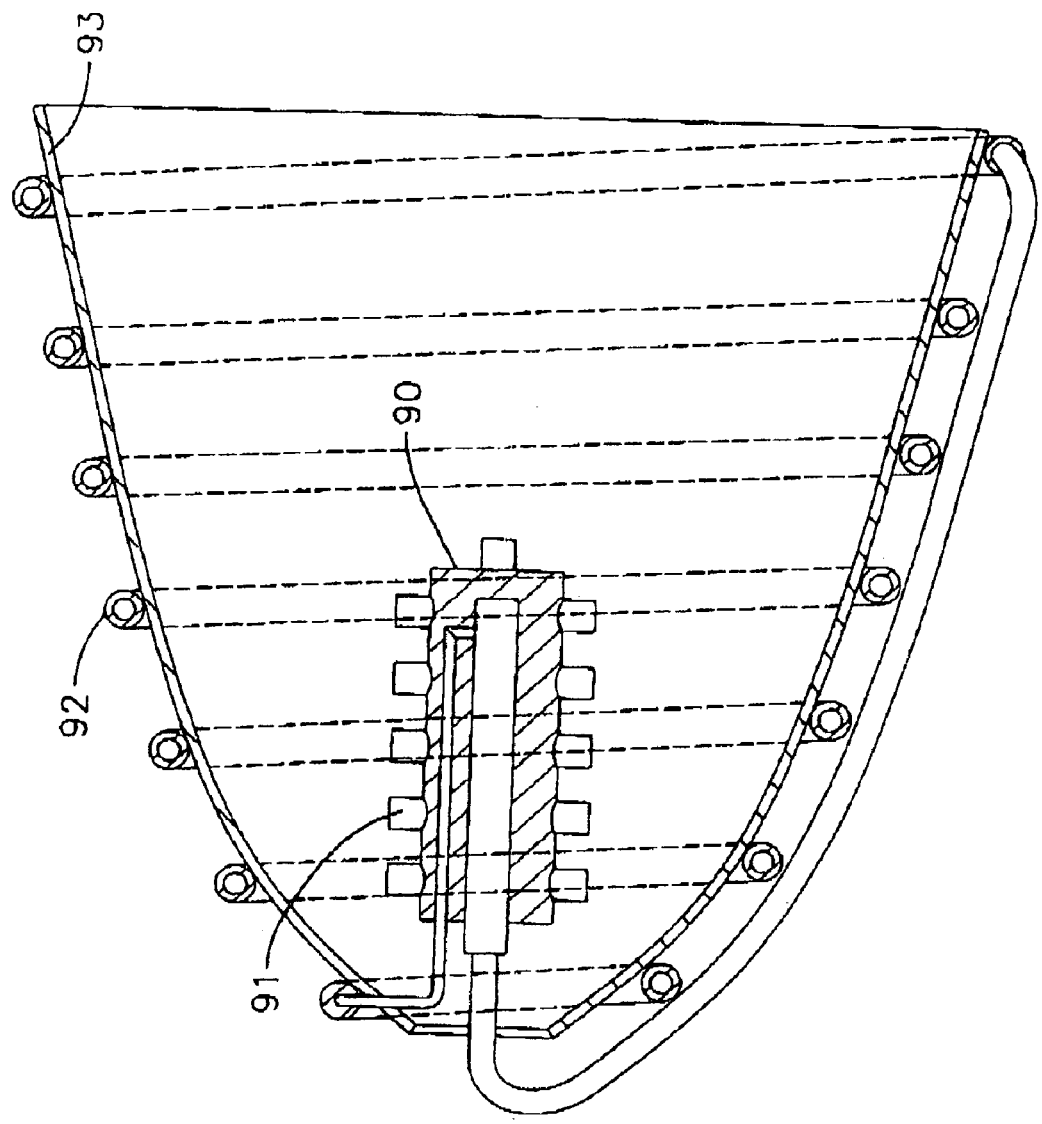
FIG. 4 is a side view in partial section of a conventional LED device with a looped heat pipe in accordance with the prior art.

The shade (10) has a cavity and is made of metal. With further reference to FIG. 3, the active heat-dissipation device is mounted in the cavity in the shade (10) and has, a cooling board (70), an evaporator (30), a condenser (40), a compressor (50), an expansion valve (60) and a refrigerant (80).

The cooling board (70) is mounted in the cavity in the shade (10) and may be composed of a heat-conducting half (71) and a heat-insulating half (72). The heat-conducting half (71) may be made of metal that has a fine thermal conductivity, and the heat-insulating half (72) may be made of polystyrene plastic that has a bad thermal conductivity.

The evaporator (30), is mounted to the cooling board (70), may be mounted between the heat-conducting half (71) and the heat-insulating half (72).

The condenser (40) is mounted to and contacts the shade (10).

The compressor (50) is mounted in the shade (10), connects to and communicates with the condenser (40) and compresses the refrigerant (80) in a gaseous state set in the condenser (40) when operating.

The expansion valve (60) is mounted on and communicates with the condenser (40) and expands the refrigerant (80) in a liquid state with high pressure into a mixture of the refrigerant (80) in the gaseous and liquid states, is called two-phase states, when operating.

The evaporator (30), condenser (40), compressor (50) and expansion valve (60) connect to each other to form a loop in which the compressor (50) connects to the condenser (40), the condenser (40) connects to the expansion valve (60), the expansion valve (60) connects to the evaporator (30), and the evaporator (30) connects to the compressor (50). The refrigerant (80) flows in the loop when the active heat-dissipation device operates.

The refrigerant (80) is set in the loop and may change between liquid, gaseous and two-phase states. Heat absorbed by the refrigerant (80) may be dissipated to the ambient atmosphere through the condenser (40) and the shade (10) contacting the condenser (40).

The LED module (20) is mounted to the active heat-dissipation device and has a base (21), an outer transparent panel (22), an inner transparent panel (23), a circuit board (24), at least one LED) (25) and two seals (26, 27).

The base (21) is mounted to the cooling board (70), may be mounted to the heat-conducting half (71), and may be composed of a heat-insulator (211), an inner section (212) and an outer section (213). The base (21) has an inner cavity (214), at least one through hole (215), a gas cavity (216), at least one hot gas by-pass (217), an inner seal (218) and at least one reflecting film (219).

The heat-insulator (211) is annular and is mounted on the heating-conducting half (71) of the cooling board (70).

The inner section (212) is mounted on the heating-insulator (211).

The outer section (213) is mounted on the inner section (212) and cooperates with the inner section (212).

The inner cavity (214) is defined in the inner section (212) of the base (21) adjacent to the cooling board (70).

The at least one through hole (215) is defined through the outer section (213), communicates with the inner cavity (214), has an inner surface and may be tanered to concentrate light from a lighting element such as an LED in the through hole (215).

The gas cavity (216) is defined in the outer section (213) of the base (21) opposite to the inner cavity (214), communicates with the at least one through hole (215) and is filled with gas having a low dew point, such as nitrogen. Such gas with a low point does not easily frost or dew.

The at least one hot gas by-pass (217) is defined through the outer section (213) of the base (21) so an user can fill refrigerant in a hot gaseous state with the at least one hot by-pass (217) to remove frost or dew in the gas cavity (216) which blocks a radiation of an LED.

The inner seal (218) is mounted between the inner section (212) and the outer section (213) around the air cavity (216).

The reflecting film (219) is attached to the inner surface of the at least one through hole (215).

The outer transparent panel (22) may be made of plastic or glass, is mounted on the outer section (213) and hermetically covers the gas cavity (216).

The inner transparent panel (23) is mounted in the gas cavity (216), may be mounted between the inner section (212) and the outer section (213) of the base (21), covers the at least one through hole (215) and cooperates with the outer transparent panel (22) to hermetically hold the gas with the low dew point between the transparent panels (22, 23). The frost or dew on the transparent panels (22, 23) which blocks the radiation of an LED may be removed by filling hot air within the at least one hot gas by-pass (217).

The circuit board (24) is mounted in the inner cavity (214) in the base (21).

The at least one LED (25) is mounted to the circuit board (24). The rays from the at least one LED (25) are concentrated by the corresponding tapered through hole (215) and reflecting film (219) to radiate in a single direction. The heat generated by the at least one operating LED (25) is absorbed by the refrigerant (80) in the liquid state through the cooling board (70). The refrigerant (80) evaporates, is compressed by the compressor (50) to have a high temperature and a high pressure. The compressed refrigerant (80) in the gaseous state passes through the condenser (40), dissipates heat and changes into liquid. The refrigerant (80) in the liquid state is expanded by the expansion valve (60) to become a mixture of the refrigerant (80), in the gaseous and liquid states, is called two-phase states, and then flows into the evaporator (30) to complete a heating-dissipation circle.

The two seals (26, 27) are mounted between the base (21) and the evaporator (30). One seal (26) is mounted around the circuit board (24) and inside the heat-insulator (211), and the other seal (27) is mounted between the circuit board (24) and heat-conducting half (71) of the cooling board (70).

The active heat-dissipation device is quiet when operating, and actively dissipates the heat from the at least one operating LED (25) without depending on the ambient temperature and ventilation. The active heat-dissipation device even lowers the temperature of the LED (25) under ambient temperature. Therefore, the active heat-dissipation device has a great heat-dissipating effect to improve the life and intensity of the LED (25).

Even though numerous characteristics and advantages of the present invention have been set forth in the foregoing description, together with details of the structure and function of the invention, the disclosure is illustrative only. Changes may be made in the details, especially in matters of shape, size, and arrangement of parts within the principles of the invention to the full extent indicated by the broad general meaning of the terms in which the appended claims are expressed.

What is claimed is:

1. A light emitting diode (LED) device comprising:
    a shade having a cavity;
    an active heat-dissipation device mounted in the cavity in the shade and having
        a cooling board mounted in the cavity in the shade;
        an evaporator mounted to the cooling board;
        a condenser contacting the shade and in which a holding refrigerant is set;
        a compressor mounted in the shade and compressing the refrigerant in a gaseous state when operating; and
        an expansion valve expanding the refrigerant in a liquid state when operating; and
    an LED module mounted to the active heat-dissipation device and having at least one LED;

wherein the evaporator, condenser, compressor and expansion valve connect to each other to form a loop in which the compressor connects to the condenser, the condenser connects to the expansion valve, the expansion valve connects to the evaporator, and the evaporator connects to the compressor, and the refrigerant flows in the loop when the active heat-dissipation device operates.

2. The LED device as claimed in claim 1, wherein the cooling board is composed of a heat-conducting half and a heat-insulating half.

3. The LED device as claimed in claim 2, wherein the LED module further has
   a base mounted to the cooling board and having
      an inner cavity defined in the base adjacent to the cooling board;
      at least one through hole defined through the base and communicating with the inner cavity and having an inner surface and through which the at least one LED extends; and
      at least one reflecting film attached to the inner surface of the at least one through hole; and
   a circuit board mounted in the inner cavity and on which the at least one LED is mounted.

4. The LED device as claimed in claim 3, wherein the at least one through hole in the base of the LED module is tapered.

5. The LED device as claimed in claim 4, wherein:
the base of the LED module further has a gas cavity defined in the base opposite to the inner cavity, communicating with the at least one through hole and filled with gas; and
the LED module further has an outer transparent panel mounted on the base and hermetically covering the gas cavity.

6. The LED device as claimed in claim 5, wherein the base of the LED module further has at least one hot gas by-pass defined through the base and is adapted to be filled with refrigerant in a hot gaseous state to remove frost or dew in the gas cavity which blocks the radiation of the at least one LED.

7. The LED device as claimed in claim 6, wherein:
the base is composed of a heat-insulator being annular and mounted on the heating-conducting half of the cooling board, an inner section mounted on the heating-insulator and an outer section mounted on the inner section;
the inner cavity is defined in the inner section;
the gas cavity is defined in the outer section; and
the outer transparent panel is mounted on the outer section.

8. The LED device as claimed in claim 7, wherein the LED module further has an inner transparent panel mounted in the gas cavity, covering the at least one through hole and cooperating with the outer transparent panel to hermetically hold the gas between the inner and outer transparent panels.

9. The LED device as claimed in claim 8, wherein the inner transparent panel is mounted between the inner section and the outer section of the base.

10. The LED device as claimed in claim 9, wherein the gas in the gas cavity of the base is nitrogen.

11. The LED device as claimed in claim 10, wherein the transparent panels are made of glass.

12. The LED device as claimed in claim 10, wherein the transparent panels are made of plastic.

13. The LED device as claimed in claim 10, wherein the shade is made of metal.

\* \* \* \* \*